(12) United States Patent
Patel (10) Patent No.: US 12,405,304 B2
(45) Date of Patent: *Sep. 2, 2025

(54) TESTING MULTI-CYCLE PATHS BASED ON CLOCK PATTERN

(71) Applicant: Advanced Micro Devices, Inc., Santa Clara, CA (US)

(72) Inventor: Nehal Patel, Santa Clara, CA (US)

(73) Assignee: Advanced Micro Devices, Inc., Santa Clara, CA (US)

(*) Notice: Subject to any disclaimer, the term of this patent is extended or adjusted under 35 U.S.C. 154(b) by 43 days.

This patent is subject to a terminal disclaimer.

(21) Appl. No.: 18/475,047

(22) Filed: Sep. 26, 2023

(65) Prior Publication Data
US 2025/0102570 A1    Mar. 27, 2025

(51) Int. Cl.
*G01R 31/317* (2006.01)
*G01R 31/319* (2006.01)

(52) U.S. Cl.
CPC .. *G01R 31/31727* (2013.01); *G01R 31/31723* (2013.01); *G01R 31/31908* (2013.01)

(58) Field of Classification Search
CPC ........ G01R 31/31727; G01R 31/31723; G01R 31/31908
See application file for complete search history.

(56) References Cited

U.S. PATENT DOCUMENTS

| | | | |
|---|---|---|---|
| 2008/0195346 A1* | 8/2008 | Lin | G01R 31/318575 |
| | | | 702/120 |
| 2017/0115352 A1* | 4/2017 | Jayaraman | G06F 11/00 |
| 2023/0349971 A1* | 11/2023 | Kuo | G01R 31/31726 |
| 2024/0329135 A1 | 10/2024 | Wingfield | |
| 2024/0427366 A1* | 12/2024 | Srinivasan | G06F 1/06 |

OTHER PUBLICATIONS

S. Oshima, T. Kato, S. Wang, Y. Sato and S. Kajihara, "On Flip-Flop Selection for Multi-cycle Scan Test with Partial Observation in Logic BIST," 2018 IEEE 27th Asian Test Symposium (ATS), Hefei, China, 2018, pp. 30-35, (Year: 2018).*
C. C. Gursoy, A. Yildiz and S. Gören, "On optimization of multi-cycle tests for test quality and application time," 2016 IEEE East-West Design & Test Symposium (EWDTS), Yerevan, Armenia, 2016, pp. 1-4 (Year: 2016).*
Wikipedia, "Automatic Test Pattern Generation", downloaded from https://en.wikipedia.org/wiki/Automatic_test_pattern_generation on Mar. 30, 2023, 5 pgs.

* cited by examiner

*Primary Examiner* — Cynthia Britt
(74) *Attorney, Agent, or Firm* — Volpe Koenig (57) ABSTRACT

A disclosed technique includes based on a clock pattern, determining an enable configuration for setting enable signals for one or more multi-cycle paths of a hardware logic network; controlling a selector to set the enable configuration for the one or more multi-cycle paths; and executing testing operations for the hardware logic network with the one or more multi-cycle paths enabled according to the enable configuration.

20 Claims, 5 Drawing Sheets

Based on clock pattern, determine enable configuration for setting enable signals for multi-cycle paths — 502

Disable and/or enable signals for multi-cycle paths based on enable configuration — 504

Execute test operations with multi-cycle paths enabled according to enable configuration — 506

TESTING MULTI-CYCLE PATHS BASED ON CLOCK PATTERN

BACKGROUND

Testing and verification of hardware integrated circuits are more difficult than those used for software. Unlike software, in which the contents of memory or other state can generally be viewed in a software debugger, integrated circuits include elements that are not readily externally visible. Additionally, hardware circuitry, such as processors manufactured by a chip fabrication corporation, may sometimes need to be tested and verified for correctness of the logic. For example, a chip fabrication corporation may need to test or verify the accuracy and performance of a new chip design when that chip is being developed or may need to verify manufactured chips as such chips are produced. Automatic test pattern generation allows for testing for many types of faults, either in the design itself, or as introduced by the manufacturing process.

BRIEF DESCRIPTION OF THE DRAWINGS

A more detailed understanding can be had from the following description, given by way of example in conjunction with the accompanying drawings wherein.

DETAILED DESCRIPTION

A disclosed technique includes based on a clock pattern, determining an enable configuration for setting enable signals for one or more multi-cycle paths of a hardware logic network; controlling a selector to set the enable configuration for the one or more multi-cycle paths; and executing testing operations for the hardware logic network with the one or more multi-cycle paths enabled according to the enable configuration. In some examples, in the event that a multi-cycle path clock pattern is not detected, the technique includes masking the multi-cycle path without the need for applying a timing constraint for pattern generation.

Figure 1:
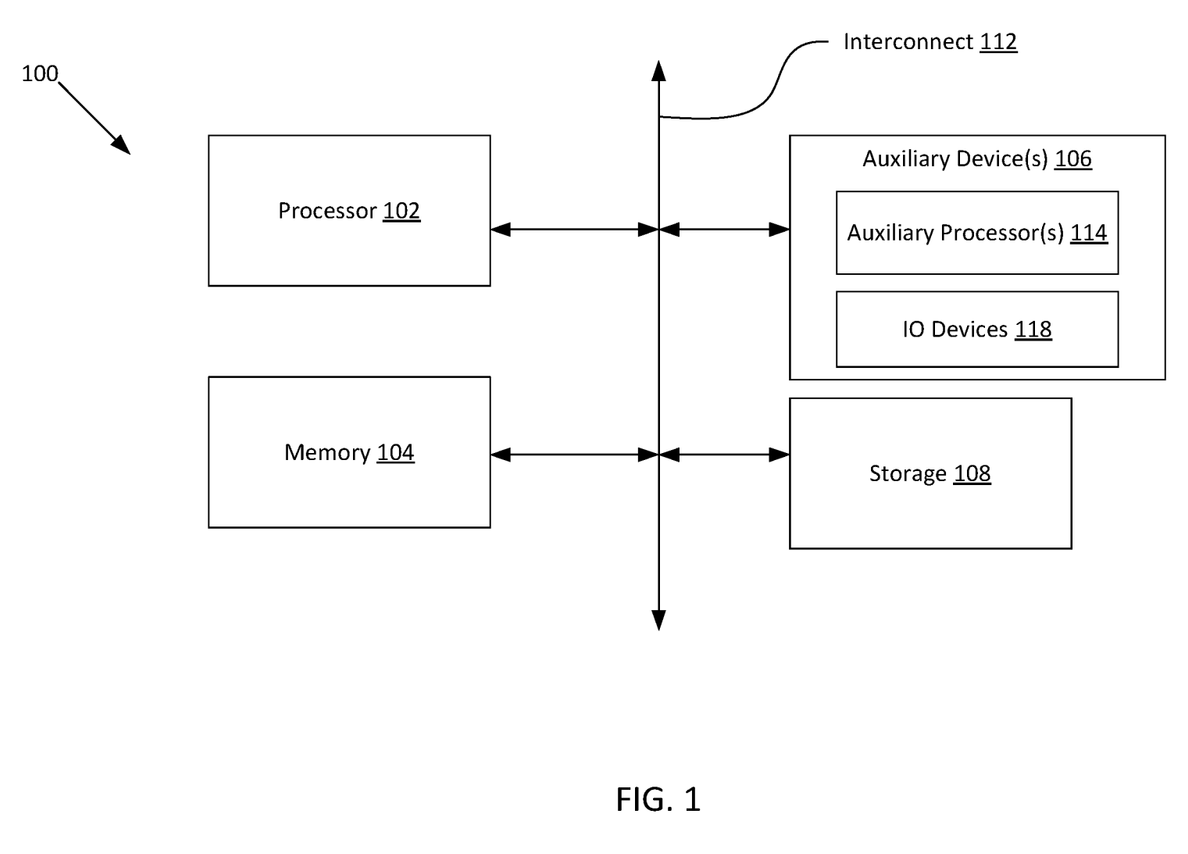
FIG. 1 is a block diagram of an example device in which one or more features of the disclosure can be implemented.

FIG. 1 is a block diagram of an example computing device 100 in which one or more features of the disclosure can be implemented. In various examples, the computing device 100 is one of, but is not limited to, for example, a computer, a gaming device, a handheld device, a set-top box, a television, a mobile phone, a tablet computer, or other computing device. The device 100 includes, without limitation, one or more processors 102, a memory 104, one or more auxiliary devices 106, and a storage 108. An interconnect 112, which can be a bus, a combination of buses, and/or any other communication component, communicatively links the one or more processors 102, the memory 104, the one or more auxiliary devices 106, and the storage 108.

In various alternatives, the one or more processors 102 include a central processing unit (CPU), a graphics processing unit (GPU), a CPU and GPU located on the same die, or one or more processor cores, wherein each processor core can be a CPU, a GPU, or a neural processor. In various alternatives, at least part of the memory 104 is located on the same die as one or more of the one or more processors 102, such as on the same chip or in an interposer arrangement, and/or at least part of the memory 104 is located separately from the one or more processors 102. The memory 104 includes a volatile or non-volatile memory, for example, random access memory (RAM), dynamic RAM, or a cache.

The storage 108 includes a fixed or removable storage, for example, without limitation, a hard disk drive, a solid state drive, an optical disk, or a flash drive. The one or more auxiliary devices 106 include, without limitation, one or more auxiliary processors 114, and/or one or more input/output ("IO") devices 118. The auxiliary processors 114 include, without limitation, a processing unit capable of executing instructions, such as a central processing unit, graphics processing unit, parallel processing unit capable of performing compute shader operations in a single-instruction-multiple-data form, multimedia accelerators such as video encoding or decoding accelerators, or any other processor. Any auxiliary processor 114 is implementable as a programmable processor that executes instructions, a fixed function processor that processes data according to fixed hardware circuitry, a combination thereof, or any other type of processor.

The one or more IO devices 118 include one or more input devices, such as a keyboard, a keypad, a touch screen, a touch pad, a detector, a microphone, an accelerometer, a gyroscope, a biometric scanner, or a network connection (e.g., a wireless local area network card for transmission and/or reception of wireless IEEE 802 signals), and/or one or more output devices such as a display, a speaker, a printer, a haptic feedback device, one or more lights, an antenna, or a network connection (e.g., a wireless local area network card for transmission and/or reception of wireless IEEE 802 signals).

Testing and verification of a digital logic device is accomplished through a variety of techniques. One such technique includes testing for faults using an automatic test pattern generator, which, in some examples, is embodied as a software application executing on a computer. There are a number of faults that can be tested for. The faults represent some malfunction in the device that would lead to incorrect operation. Some examples include stuck-at faults (logic stuck at a value), transistor faults (transistor malfunction), transition delay faults (e.g., slow to rise, slow to fall), bridging faults (e.g., short circuiting), or other faults. This technique involves configuring the automatic test pattern generator with information about the digital logic device. This information includes information characterizing the circuit configuration of the digital logic device, including, e.g., the layout of the design, foundry standard cell library, and fault list. The automatic test pattern generator generates a test pattern and simulates the results of that test pattern in an internal simulator. A testing tool provides the test pattern to the digital logic device, causes the digital logic device to operate for a certain amount of time, reads out the results from the device, and compares the results to the results of the simulation.

Figure 2:
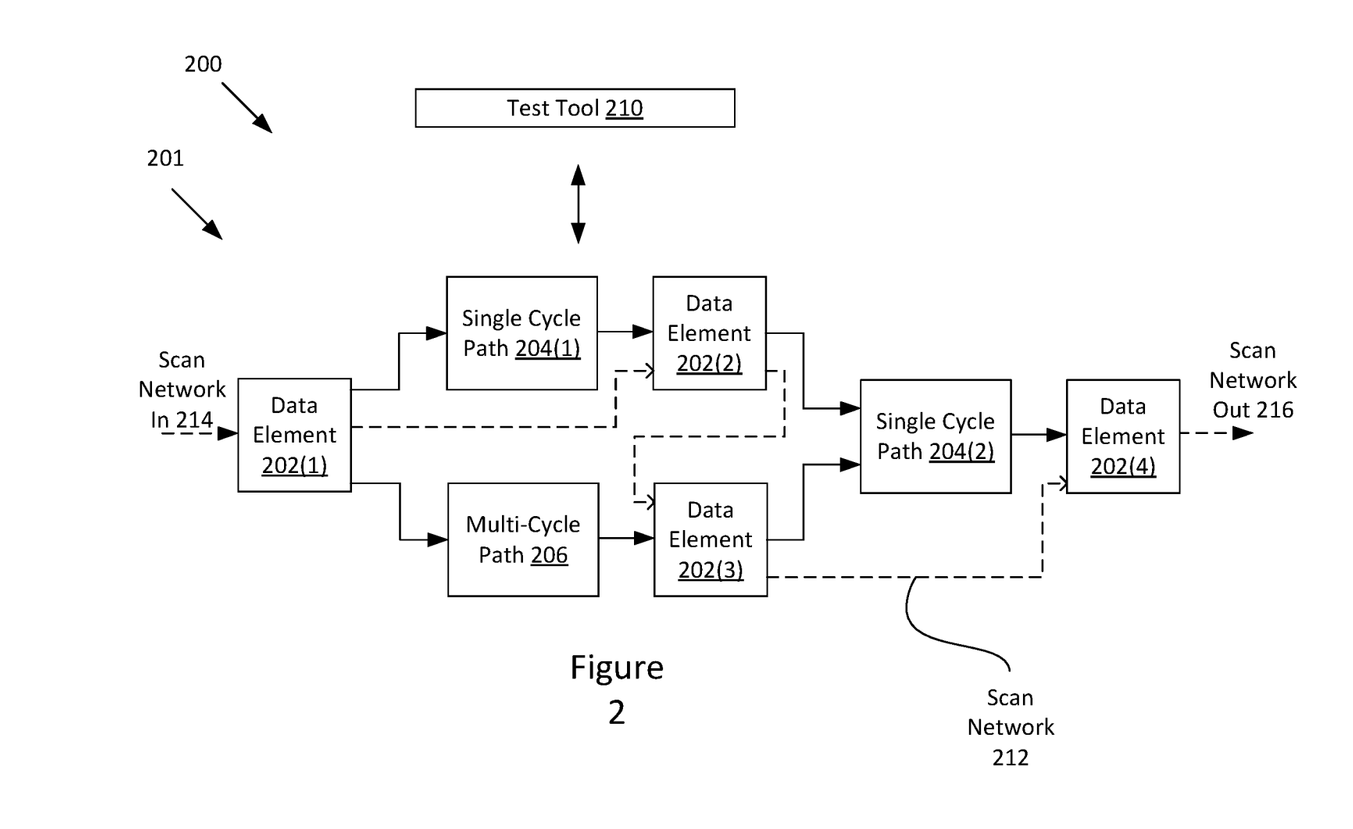
FIG. 2 illustrates an example hardware logic network, according to an example.

FIG. 2 illustrates an example hardware logic network 200, according to an example. The hardware logic network 200 is, generally, the "normal" functional components of a hardware processing device that perform the desired functionality of that device. In an example, where the device is a processor (e.g., a central processing unit), the hardware logic network 200 is the circuit elements that together perform the functionality of the processor. Note that in FIG. 2, only a small portion of the hardware logic element 200 that would be the part of a device is illustrated. Although much of the hardware logic element 200 is not shown, it should be understood that the functionality described with respect to the illustrated elements also apply to other elements not shown.

The illustrated hardware logic network 200 includes a number of data elements 202, two single cycle paths 204, and a multi-cycle path 206. The data elements 202 are elements that store data. An example of a data element 202 is a flip flop, which stores data provided as input. It should be understood that data elements 202 operate based on a clock signal. A clock signal is a signal whose value periodically varies between a logical low and a logical high (or 0 or 1, or low voltage and high voltage), at the rate of a particular clock frequency. Clock signals are said to have edges, which are the transitions between two logical values. A data element 202 stores a logical value (e.g., a 0 or a 1) and also outputs the stored value on its output. When a clock edge occurs, the data element 202 changes the stored value to the value provided at the input of the data element 202.

The "paths" of FIG. 2 are the hardware circuit elements that perform the logic flow of the device 201. For example, these paths may include logic gates, transistors, or other elements that implement the logic flow of the device. Each path—e.g., a single cycle path 204 or a multi-cycle path 206—includes a combination of one or more logic elements (e.g., logic gates, transistors, etc.) that accept input from one or more data elements 202, performs operations (e.g., logic operations) on that input, and provides an output to a data element 202. In combination, the paths (both single cycle paths 204 and multi-cycle paths 206) and the data elements 202 implement the functionality of the device 201. In an example, the paths and data elements 202 implement the functionality of a central processing unit or other digital circuit.

The single cycle paths 204 differ from the multi-cycle paths 206 in terms of the propagation delay across the circuit elements of those paths. Propagation delay means the amount of time that it takes a signal to travel from the input of a single cycle path 204 or multi-cycle path 206 to the output of the single cycle path 204 or multi-cycle path 206. More specifically, the hardware logic network 200 is intended to be operated at a given minimum clock period. At that clock period, the propagation delay for a single-cycle path 204 is small enough to fit within a single cycle (period) of the clock signal. The propagation delay for a multi-cycle path is not small enough to fit within a single cycle, but is small enough to fit within a number of cycles specified for that multi-cycle path 206. The number of cycles required for a signal to traverse path (single cycle path 204 or multi-cycle path 206) is sometimes referred to herein as the "cycle closure" of that path. For example, single cycle paths 204 have single-cycle closure. In some examples, multi-cycle paths 206 have two-cycle closure, three-cycle closure, four-cycle closure, and so on. It should be understood that the cycle closure of a path specifies the amount of time needed for a signal provided to the input of that path to propagate to the output of that path such that a stable output is produced at the output. If the propagation delay across a path is longer than required (e.g., longer than one cycle for a single cycle path 204 or longer that two cycles for a two-cycle path), then the output of that path is considered unreliable, and the data stored in the data element 202 at the output of that path is unreliable.

As described above, a test tool 210 tests the various elements of the hardware logic network 200 for faults. The test tool 210 is embodied as hardware (e.g., circuitry, including any form of processor, fixed-function circuitry, combination thereof, or other circuitry), software (e.g., executing on a processor), or a combination thereof. In some examples, the test tool 210 is or includes an automatic test pattern generator. To test the elements of the hardware logic network 200 for faults, the test tool 210 generates an "input pattern" of data and inputs this pattern of data into the data elements 202. The test tool 210 then causes the hardware logic network 200 to execute for one or more clock cycles, and reads the result as an "output pattern" from the data elements 202. The input pattern is transformed, by the hardware logic network 200, into the output pattern. Stated differently, the test tool 210 "initializes" the hardware logic network 200 with an input pattern. The test tool 210 then causes the hardware logic network 200 to process the input pattern to generate an output pattern. The test tool 210 then reads out the output pattern.

A scan network 212 is present to assist with loading data into and out of the data elements 202. The scan network includes direct connections between data elements 202 so that data can be serially read into the network one data element 202 at a time. The set of dashed lines in FIG. 2 represents this set of direct connections between the data elements 202. As can be seen, there is a path through all of the data elements 202 via the scan network 212. The scan network 212 is a serial connection through each of the data elements 202. Even though the hardware logic network 200 and the scan network 212 both have paths through the data elements 202, these two networks have different functions. The scan network 212 functions to load data into the data elements 202, bypassing the paths of the hardware logic network 200. The hardware logic network 200 is the actual functional logic network of the device. Again, the scan network 212 functions to load data into the data elements 202 for scan testing and the hardware logic network 200, which represents the functional logic of the device, is the functional hardware logic that is tested by the scan test. This hardware logic network 200 also represents the part of the device that performs the actual logical operations of the device.

To load in data using the scan network 212, the test tool 210 provides a sequence of data to scan network in 214, and to read out data using the scan network 212, the test tool 210 reads out a sequence from scan network out 216. Once the scan network 212 is used to load data into the data elements 202, the test tool 210 causes the hardware logic network 200 to operate using the logic paths 204, 206, which do not use the scan network 212. Put differently, in some examples, the test tool 210 tests operation of the hardware logic network 200 by loading data into the data elements 202, causing the hardware logic network 200 to execute for a certain number of cycles, reading the results out from the data elements 202, and verifying that these results match what is expected. The hardware logic network 200 (solid lines) represent the "real" logic of the device. The scan network 212 is present to assist with loading the data into the data elements 202 and extracting the data out of the data elements 202. While the hardware logic network 200 has complex interconnectivity between data elements 202 and the logic paths, which is necessary for normal operation, that scan network 212 is notable for its simple connectivity between data elements 202 that bypasses the logic paths. Data is read in by feeding data serially (e.g., one bit per clock cycle) into the scan network in 214, and that data thus flows through the scan network data element 202 by data element 202. Data is read out by reading data from the scan network out 216 as the data flows out via the scan network 212, data element 202 by data element 202.

In the scan network 212 illustrated, output of data element 202(1) is coupled as input to data element 202(2), output of data element 202(2) is coupled as input to data element 202(3), and output of data element 202(3) is coupled as input to data element 202(4). This interconnectivity results in a serialized sequence of data elements 202.

In order to consistently test a large number of different types of faults, the test tool 210 generates a very large number of test patterns to load into the paths via the scan network 212 for testing. The term "test pattern" means the set of data loaded into the different data elements 202. Different test patterns vary in whether and how well those test patterns can detect faults in the hardware logic network 200.

To generate these patterns, the test tool 210 stores a model of the hardware logic network 200. The model indicates the elements (e.g., paths and data elements 202) that exist in the network 200 and also indicates their connectivity. This model allows the test tool 210 to simulate the operation of the hardware logic network 200. The test tool 210 simulates this operation for several reasons. Specifically, the simulation allows the test tool 210 to generate test patterns to be loaded into the hardware logic 200. More specifically, the simulation allows the test tool 210 to evaluate candidate test patterns (which can be created in any technically feasible manner) for how well such candidate test patterns can test for faults, where a "fault" is an error in the device. For example, some test patterns may test the operation of the hardware logic network 200 in a way that reveals a first type of fault while other test patterns may test the operation of the hardware logic network 200 in a way that reveals a second type of fault. Some test patterns may not be capable of assisting with detecting any faults. Some test patterns may be better at detecting a first type of fault than other test patterns. To perform robust fault testing for a large variety of faults, the hardware logic network 200 generates a very large number of test patterns. The simulation also allows the test tool 210 to understand how the hardware logic network 200 should operate, so that when the test tool 210 reads out the data from the scan network 212, the test tool 210 can determine whether a fault actually exists. For example, if the simulation indicates that, after operation, data element 202 (4) should store a first value, and the value actually read out from data element 202(4) is a second value, then the test tool 210 determines that a fault occurs.

Again, the test tool 210 is capable of detecting a large number of different types of faults, by generating a large number of different test patterns. Due to the computational difficulty, in order to generate a suitable number of test patterns, the test tool 210 takes certain computational shortcuts. One such shortcut is that the test tool 210 assumes all paths, including single cycle paths 204 and multi-cycle paths 206, are single cycle paths 204. This means that the test tool 210 is incapable of properly testing multi-cycle paths 206. In addition, in some examples, the test tool 210 reads timing exceptions and generates patterns such that the multi-cycle path endpoint (data element 202(3)) is masked. For this reason, techniques are provided herein for allowing the test tool 210 to test multi-cycle paths.

Figure 3:
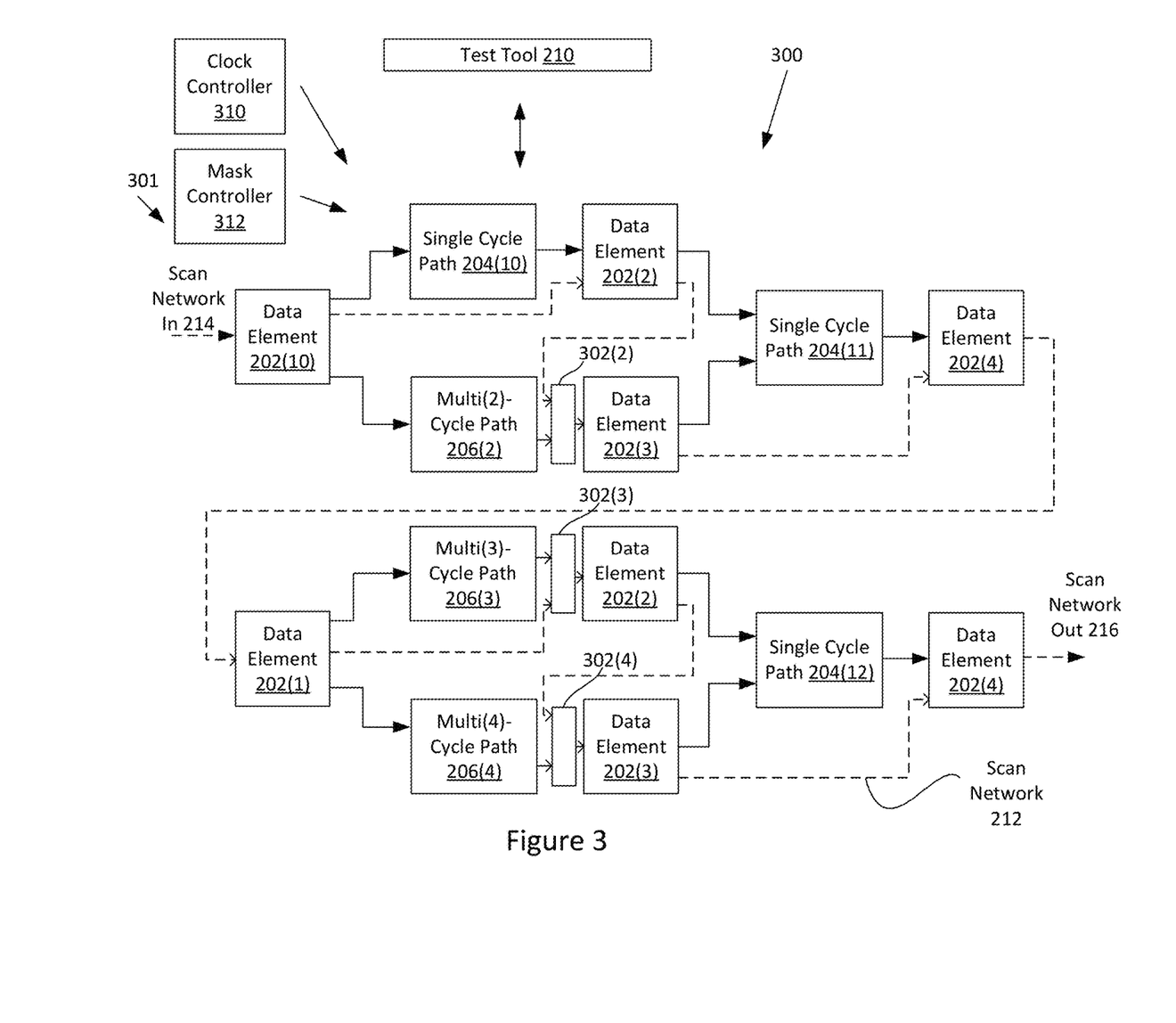
FIG. 3 illustrates an electronic device including a hardware logic network, according to an example.

FIG. 3 illustrates an electronic device 301 including a hardware logic network 300, according to an example. The hardware logic network 300 is similar to the hardware logic network 200 of FIG. 2, in that the hardware logic network 300 includes data elements 202, single cycle paths 204, and multi-cycle paths 206. The electronic device 301 also includes a clock controller 310 and a mask controller 312. The device 301 also includes a scan network 212 which is similar to the scan network 212 of FIG. 2. In some examples, the test tool 210 is part of the electronic device 301 and in other examples, the test tool 210 is external to the electronic device 301.

As described above, the test tool 210 is not capable, without special treatment, of generating test patterns and evaluating the results of testing, in order to test multi-cycle paths 206 for faults. In general, this is because the test tool 210 must simulate aspects of the hardware logic network 300 to generate a large number of test patterns, and in order to perform this activity, the test tool 210 must assume that all paths have single cycle closure.

For this reason, the electronic device 301 includes a number of features that allow the test tool 210 to test faults for multi-cycle paths 206. These features include a mask controller 312 and input selectors 302. The mask controller 312 enables or disables multi-cycle paths using input selectors 302 for the data element 202 subsequent to such paths More specifically, data elements 202 that follow the multi-cycle paths 206 have associated input selectors 302. The input selectors 302 select between the multi-cycle path, the scan network 212, or a fixed value disabling signal (not shown in FIG. 3). In the situation that the hardware logic network 300 is enabled (e.g., for normal operation), the input selector 302 selects as input output from the multi-cycle path 206. In the situation that the hardware logic network 300 is not enabled and the device is inputting or outputting data via the scan network 212 (e.g., for testing), the input selector 302 selects the input from the previous data element 202 in the scan network 212 (or from the scan network in 214). In the situation that the test tool 210 is testing the operation of the device (e.g., after the data has been loaded in via the scan network 212 and while the test pattern is propagating through the hardware logic network 300 for testing), the input selector 302 selects either the fixed value disabling signal or the input from the immediately prior multi-cycle path 206 as input.

Whether the input selector 302 selects the fixed value disabling signal or the input from the multi-cycle path 206 is based on whether the mask controller 312 determines that the multi-cycle path 206 is to be disabled or enabled. More specifically, as disclosed elsewhere herein, the mask controller 312 determines whether to "enable" paths having particular cycle closures based on the input clock signal during testing. In the event that the mask controller 312 determines to enable a multi-cycle path 206 having a particular cycle closure, the input selector 302 subsequent to that multi-cycle path 206 selects the input from the multi-cycle path 206. In the event that the mask controller 312 determines to disable such a multi-cycle path 206, the input selector 302 selects the fixed value disabling signal. In some examples, the fixed value disabling signal is a high value or a low value (e.g., a logical 1 or a 0) such that, when disabled, the data element 202 inputs and stores that fixed value.

Note that the data elements 202 following the single cycle paths 204 also receive input from either the scan network 212 or the hardware logic network 300. Thus, such data elements 202 would also have a selector that selects between those elements depending on whether the scan network 212 is being used to input or output values for testing or whether either normal operation or testing is occurring. In some examples, however, these data elements do not receive a fixed value disabling signal as the data elements 202 subsequent to the single cycle paths 204 are not disabled, in contrast with those that follow the multi-cycle paths 206.

During testing, the input selectors 302 select inputs appropriately in order to test multi-cycle paths 206 having different cycle closures at different times. More specifically, as described above, the test tool 210 assumes that each path is a single-cycle path in generating test patterns. However, it is possible to "trick" the test tool 210 into generating test patterns for multi-cycle paths 206. Specifically, if the test tool 210 is configured with information indicating that a multi-cycle path 206 has single cycle closure, and if the hardware logic network 300 is operated with a clock rate that results in a single clock cycle occurring for propagation across a multi-cycle path (e.g., with half of the clock rate for a two cycle path), then the test tool 210 will be able to generate test patterns for particular multi-cycle paths 206 that will allow the test tool 210 to accurately detect faults for the multi-cycle paths 206. More specifically, configuring the test tool 210 to consider multi-cycle paths 206 as having single cycle closure allows the test tool 210 to simulate the hardware logic network 300 to appropriately generate test patterns to test a variety of faults as mentioned above.

One important aspect of this simulation is simulating timing. The test tool 210 can generate test patterns to test timing related faults because the test tool 210 "believes" that a multi-cycle path 206 has single cycle closure. However, to appropriately test timing aspects of a multi-cycle path 206, the actual clock rate of the device 301 must align with the cycle closure of the multi-cycle path 206 being tested. For example, for a multi cycle path 206 with two cycle closure, the clock controller 310 controls the hardware logic network 300 to execute at half of the clock speed for testing single cycle paths 204. In another example, for a multi cycle path 206 with three cycle closure, the clock controller 310 controls the hardware logic network 300 to execute at one third of the clock speed for testing single cycle paths 204.

By operating the hardware logic network 300 at a clock rate that is appropriate for multi-cycle paths 206 of a given cycle closure, the test tool 210 is able to test for faults, including timing faults, in such multi-cycle paths 206. Importantly, however, the test tool 210 is only able to test for timing faults for multi-cycle paths 206 having the same cycle closure, at any given time, as the timing requirement is different for paths having different cycle closures. Thus, for any given test pattern execution, the test tool 210 tests paths of the same cycle closure for timing faults, and does not test paths having any other cycle closure for timing faults. It is possible in some instances to test multi-cycle paths having a faster cycle closure for faults in this instance as well. A test pattern execution includes loading the test pattern into the data elements 202 (e.g., via the scan network 212), causing the hardware logic network 300 to run for a certain number of clock cycles, loading out the results from the scan network 212, and evaluating the results as compared with the results of the simulation. In addition, the mask controller 312 disables, via the selectors 302, any multi-cycle path 206 having a cycle closure that is not being tested, and enables, via the selectors 302, the multi-cycle paths 206 that are being tested. Note that it is possible to perform tests other than timing tests for multi-cycle paths having different cycle closures at the same time. However, at any given time, the timing tests are performed for multi-cycle paths 206 having the same or less cycle closure (e.g., when multi-cycle 3 is targeted, multi-cycle-2 and single cycle paths are also tested but as lower frequency) and not for paths having any other cycle closure. In general, it is possible to perform non-timing tests for paths having a shorter cycle closure than the path for which timing tests are being performed, but it is not possible to perform non-timing tests for paths having a longer cycle closure than the path for which timing tests are being performed. It is possible to perform non-timing tests for paths having different cycle closures because paths having a shorter cycle closure than the cycle closure being tested will have a stable output before the clock period is complete. However, attempting to perform timing tests for such shorter cycle closure paths would be ineffective. Specifically, since timing requirements indicate that such shorter cycle closure paths need to have a stable output at a particular cycle closure, testing the output of such paths using a longer clock period does not test that such paths have actually reached a stable output at the shorter cycle closure.

In some examples, the overall flow for testing faults for different multi-cycle paths is as follows. Initially, a tester (e.g., test tool 210) sets a clock control logic appropriate for a maximum cycle closure multi-cycle path. The tester generates at-speed scan test patterns. The tester also generates tests for certain types of faults (e.g., stuck-at faults) for multi-cycle paths having cycle closures that are less than the maximum. The tester generates test patterns to cover all at-speed faults for all multi-cycle paths, meaning the tester repeats the above steps for the multi-cycle paths having a cycle closure of the maximum cycle closure minus 1, then minus 2, and so on. After at-speed faults are tested, the tester determines which stuck-at faults have not yet been tested and generates test patterns to test the remaining stuck-at faults.

Above it is stated that non-timing tests and timing tests can be performed. Timing tests are tests that determine whether a particular path has a stable and correct output after the input to that path changes and an appropriate amount of time has passed. The appropriate amount of time is the number of clock periods associated with the cycle closure for that path (e.g., two single cycle closure clock periods for a two cycle closure path). Non-timing tests are tests that determine whether the output of a path is correct, but such tests do not test for the timing aspect of such paths. For example, it is possible to determine whether the logic of a particular path is correct without considering whether the output of that path is stable or correct within a given time period.

In some examples, for a multi-cycle path having a cycle closure that is too long to be tested for a particular test, it is important to disable, via the selectors 302, such paths. If such paths were not disabled, then the results output from such multi-cycle paths are not correct and could propagate and corrupt results from other paths that are correct. Thus, in some examples, in instances where the mask controller 312 determines that a multi-cycle path 206 cannot be tested due to having a cycle closure that is longer than what is considered appropriate for the current clock signal (e.g., too long for the current clock signal), the mask controller 312 controls the selector 302 to disable the corresponding data element 202 (e.g., by causing the selector 302 to select the fixed value disabling signal). Again, this determination is based on the clock signal indicated by the test tool and implemented by the clock controller 310.

In some examples, the mask controller 312 automatically determines which cycle closure a particular test pattern is being run with, based on an input clock pattern provided by the test tool 210 to the clock controller 310 at the time that the test pattern is run. More specifically, when the test tool 210 generates a test pattern for a particular cycle closure, the test tool 210 also generates or selects a clock pattern to be provided to the clock controller 310. The clock pattern controls the clocking of the data elements 202. More specifically, the clock pattern indicates which cycles of a master clock the data elements 202 load new data in from their inputs. In some examples, the clock pattern includes a sequence of bits. Each bit indicates whether the data elements 202 should load data from its input on a particular clock cycle. In an example, a clock pattern includes bits 1, 0, and then 1. In this example, the data elements would load the value at their input into internal storage in a first clock cycle, then ignore the input (maintain the internal storage value) in a second cycle, and then again load the input into internal storage in a third cycle. In this example, there are two master clock cycles between when data elements 202 load input values, which is enough time for a multi-cycle path 206 having two cycle closure to produce a stable output, but is not enough time for a multi-cycle path 206 having more than two cycle closure to produce a stable output. This timing is also not appropriate for testing all aspects of single cycle paths 204, such as timing aspects, since the amount of time allowed is greater than that needed by the single cycle paths 204 to produce a stable output. In another example, a clock pattern of 1, 0, 0, 1 is appropriate for multi-cycle paths 206 having three cycle closure, and a clock pattern of 1, 0, 0, 0, 1 is appropriate for multi-cycle paths 206 having four cycle closure. As can be seen, the clock pattern is associated with a particular cycle closure. A clock pattern is appropriate for a multi-cycle path 206 having a particular cycle closure if the clock pattern provides a number of cycles between when data elements 202 update their internal values equal to the number of cycles of the cycle closure. For example, 1, 0, 1 provides two clock cycles between updating data elements 202 and is thus appropriate for a two cycle closure.

When the test tool 210 provides a clock pattern to the device 301, the mask controller 312 examines that clock pattern and determines which data elements 202 to enable via the selectors 302. For clock patterns appropriate for a particular cycle closure for a multi-cycle path 206, the mask controller 312 causes the selectors 302 for the multi-cycle paths 206 for that cycle closure to be enabled, and causes the multi-cycle paths 206 for longer cycle closure to be disabled. In an example, for a three cycle closure test, the clock pattern appropriate for such test would enable the three cycle multi-cycle paths 206 and would disable the multi-cycle paths 206 having cycle closure greater than three cycles. For clock patterns appropriate for a single cycle path 204 (e.g., 1, 1, 1, having a single cycle between data element 202 data capture), the mask controller 312 causes the selectors 302 to disable all multi-cycle paths 206. As a result of this action, the test tool 210 is able to test paths having any cycle closure by disabling multi-cycle paths 206 according to a clock signal. The test tool 210 is thus able to test paths having different cycle closures by generating an appropriate clock signal and providing that clock signal to the device 301, which enables or disables the appropriate multi-cycle paths 206 according to the clock signal.

In some examples, the following table illustrates tests performed for different paths (e.g., multi-cycle paths 206 or single cycle paths) with different clock signals:

TABLE 1

Clock patterns result in certain types of tests for certain cycle closures

| Clock pattern | Single cycle paths | MCP2 | MCP3 | MCP4 | MCP4 |
|---|---|---|---|---|---|
| 1111111 | Enabled (at speed coverage) | Disabled | Disabled | Disabled | Disabled |
| 1010101 | Enabled (stuck at coverage) | Enabled (at speed coverage) | Disabled | Disabled | Disabled |
| 1001001 | Enabled (stuck at coverage) | Enabled (stuck at coverage) | Enabled (at speed coverage) | Disabled | Disabled |
| 1000100 | Enabled (stuck at coverage) | Enabled (stuck at coverage) | Enabled (stuck at coverage) | Enabled (at speed coverage) | Disabled |

Table 1 illustrates which types of tests are used for paths of a given cycle closure, or whether those paths are disabled. The clock pattern represents the effective clock pattern, based on a master clock pattern. For example, for a sequence of sequential 1's, the effective clock pattern matches the master clock pattern. For alternating 1's and 0's (e.g., 101010), the effective clock pattern is half of the master clock pattern. For a 1 every $3^{rd}$ clock cycle, the effective clock pattern is one third of the master clock pattern, and so on.

The features described above can also be used to perform transition testing. More specifically, transition testing involves testing connections between clock domains. A clock domain is a portion of a device connected to a particular clock signal. Different clock domains can have different clock frequencies. To send signals between clock domains, a clock domain transition is present. The delay across a clock domain transition can be multiple cycles, and thus a clock domain transition acts, in a sense, as a multi-cycle path. These clock domain transitions are hardware circuitry that perform the task of transferring signals between domains. In various examples, one or more clock domain transitions have selectors 302. The test tool 210 generates a test pattern to test the clock domain transitions and provides a clock pattern to the device 301. The clock pattern indicates the number of cycles of delay that occur at the transition as described above. The device 301 (specifically, the mask controller 312) enables or disables clock domain transitions based on this number of cycles.

The techniques described herein can also allow for logic built-in self-test for multi-cycle paths. More specifically, logic built-in self-test is a feature internal to an electronic device that runs tests to verify that the device is free of faults. One use of logic built-in self-test is to produce a deterministic test result for a range of clock periods. However, the result of a multi-cycle path 206 is not deterministic during tests applied at clock periods shorter than the timing closure of the multi-cycle path 206. The automatic enable feature of mask controller 312 operates with the logic built-in self-test by enabling multi-cycle paths only for self-test patterns that have a clock pattern that can deterministically operate those multi-cycle paths at the appropriate cycle closure, and disabling them for self-test patterns containing a clock pattern that is too short to deterministically operate the multi-cycle paths.

Figure 4:
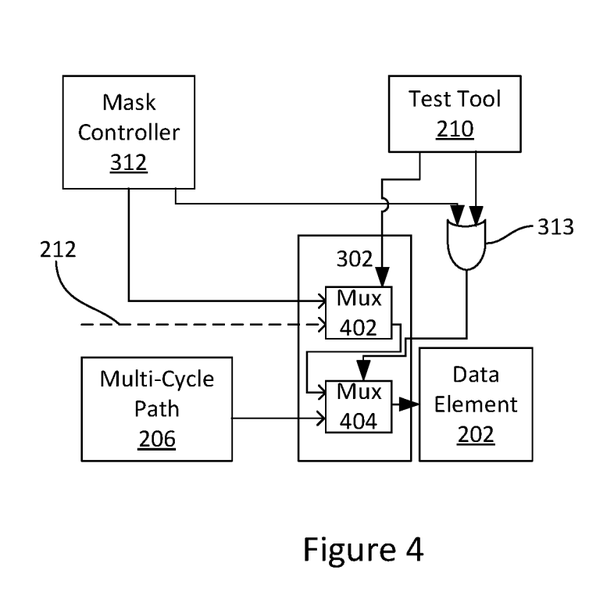
FIG. 4 illustrates a selector, according to an example.

FIG. 4 illustrates an example implementation of an input selector 302 for data elements 202 that follow the multi-cycle paths 206. The input selector 302 includes a first multiplexor 402 and a second multiplexor 404. The first multiplexor 402 selects as input either a fixed value disable signal from the mask controller 312 or input from the scan network 212 and provides output to the second multiplexor 404. The selection signal for the first multiplexor 402 also comes from the test tool 210. The second multiplexor 404 accepts input from either the first multiplexor 402 or the multi-cycle path 206 and provides output to the data element 202 corresponding to the multi-cycle path 206. The test tool 210 and mask controller 312 provide the selection signal to the second multiplexor 404 via an OR gate (if either the test tool 210 or the mask controller 312 indicate that the output from the first MUX 402 should be used, then the MUX 404 selects that output and if neither the test tool 210 nor the mask controller 312 indicates that such output should be used, then the MUX 404 selects the output of the multi-cycle path 206).

The fixed value disable signal is said to be "off the critical path," "off of a critical path," or "not affecting propagation delay between data elements 202 for the multi-cycle path 206." In other words, the element that introduces this signal to the data element 202 does not add additional propagation delay to the path between the data element 202 illustrated and the data element preceding the multi-cycle path 206. More specifically, the second multiplexor 404 already exists as a means for selecting between the output of the multi-cycle path 206 and the scan network 212 for testing. Providing the multiplexor 402 to select between the scan network 212 and the disable signal does not add to the propagation delay in the path that includes the second multiplexor 404. More specifically, the propagation delay that happens for normal operation of the device is when input from the multi-cycle path 206 is selected. When this input is selected, the propagation through the multiplexor 402 does not matter.

To operate the selector 302, the test tool 210 and mask controller 312 select either the multi-cycle path 206 (when appropriate clock pattern is detected) or the output from the first multiplexor 402. Specifically, when the test tool 210 is providing a pattern into the device via the scan network 212, the test tool 210 selects the output from the first multiplexor 402. Also, if the test tool 210 is performing testing on the device, meaning that the test tool 210 is causing the device to process the provided pattern through the hardware logic network 300, the test tool 210 and mask controller 312 cause the second multiplexor 404 to select either the multi-cycle path 206 or the first multiplexor 402 as input, based on whether the multi-cycle path 206 is enabled or disabled. If the multi-cycle path 206 is enabled, then the test tool 210 and mask controller 312 cause the second multiplexor 404 to select the multi-cycle path 206 as input. If the multi-cycle path 206 is disabled, then the test tool 210 and mask controller 312 cause the second multiplexor 404 to select the first multiplexor 402 as input. In addition, in this scenario, the mask controller 312 causes the first multiplexor 402 to select the fixed value disable signal as input. Thus, in the case where testing is being performed and the multi-cycle path 206 is disabled, the second multiplexor 404 selects the first multiplexor 402 as input and the first multiplexor 402 provides the disable signal to the data element 202, thereby selecting the disable signal for the data element 202 and effectively disabling the multi-cycle path 206. As has been illustrated, the selector 302 allows the multi-cycle path 206 to be disabled without introducing additional propagation delay as compared with what already exists for the scan network 212.

Figure 5:
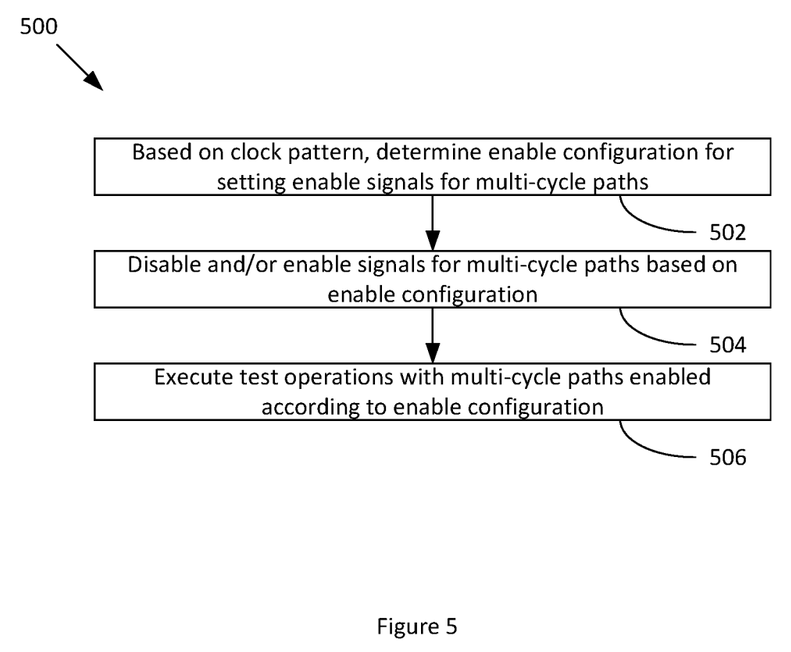
FIG. 5 is a flow diagram of a method for testing a hardware logic network, according to an example.

FIG. 5 is a flow diagram of a method 500 for testing a hardware logic network, according to an example. Although described with respect to the systems of FIGS. 1-4, those of skill in the art will recognize that any system, configured to perform the operations described herein in any technically feasible order, falls within the scope of the present disclosure.

At step 502, based on a clock pattern, an electronic device (e.g., device 301) determines an enable configuration for setting selectors 302 for multi-cycle paths 206. In some examples, a test tool 210 generates the clock pattern based on test patterns. The test patterns include data to be loaded into the hardware logic network (such as hardware logic network 300), via a scan network 212. In some examples, the electronic device receives the test pattern from the test tool 210 and also receives the clock pattern from the test tool 210. In some examples, the test tool 210 generates a large number of test patterns in order to detect faults in the hardware logic network 300. The test tool 210 also generates clock patterns for the test patterns. Each test pattern is intended to test various faults. In some examples, various such test patterns are capable of testing timing faults for paths having a specific cycle closure. The clock pattern that is generated is associated with that cycle closure. More specifically, the clock pattern that is generated causes the data elements 202 to update their contents based on their inputs after a number of clock cycles related to the cycle closure. For example, for testing multi-cycle paths 206 having two-cycle closure, the clock pattern indicates that the data elements 202 should update contents based on input on a first master clock cycle, then skip updating contents based on input on a second master clock cycle, and then update contents based on input on a third master clock cycle. The device (e.g., via a mask controller 312) determines which multi-cycle paths 206 to enable or disable based on the clock pattern. For example, for a clock pattern appropriate for two-cycle closure, the mask controller 312 determines to enable the two-cycle closure multi-cycle paths 206 and determines to disable multi-cycle paths 206 having longer cycle closures.

In generating the test pattern for a cycle closure greater than one cycle closure, the test tool 210 simulates the hardware logic network 300 as if the multi-cycle paths 206 corresponding to the cycle closure being tested have a single cycle closure. For example, if multi-cycle paths having two cycle closure are being tested, then the test tool 210 simulates the hardware logic network 300 as if the two cycle multi-cycle paths 206 had single cycle closure. The clock pattern generated allows the hardware logic network 300 to operate as if the two cycle multi-cycle paths 206 actually had single cycle closure.

The test tool 210 is able to generate test patterns that can test for timing faults for a specific cycle closure and also can test for non-timing faults for other cycle closures. In other words, the test tool 210 can generate patterns where each individual pattern can test for both such timing faults and such non-timing fault. As described above, timing fault tests are only valid for a specific cycle closure. However, an individual test pattern that tests for timing faults for a specific cycle closure can still test for logic faults that are not timing related for other cycle closures, as long as those other cycle closures have a shorter cycle closure than the cycle closure being tested for timing faults.

Thus, in some examples, the test tool 210 generates test patterns in the order of longest to shortest cycle closure. More specifically, the test tool 210 generates test patterns to test for timing faults in the longest cycle closure, where at least some of those test patterns also test non-timing faults in paths having a shorter cycle closure. The test tool 210 also generates test patterns to test for timing faults in the next-shortest cycle closure, where at least some of those test patterns also test non-timing faults for shorter cycle closures. The test tool 210 continues this process until tests testing timings for all cycle closure to be tested have been generated. The test tool 210 provides these patterns to the device and the device performs these tests. In some examples, the device performs these tests in the order of which cycle closure is being tested for timing based faults, in the order of longest to shortest cycle closure. In some examples, the mask controller 312 controls the selectors 302 to enable or disable the multi-cycle paths 206 for testing, in this order.

At step 504, the mask controller 312 enables and/or disables multi-cycle paths 206 based on the determination of step 502. At step 506, the hardware logic network 300 executes test operations with the multi-cycle paths enabled and disabled according to the enable configuration (the determination of which should be enabled and disabled in step 502). In various examples, this execution includes loading the associated test pattern into the hardware logic network 300 (data elements 202), causing the hardware logic device 300 to operate as "normal," but with the multi-cycle paths 206 enabled and disabled as described, and according to the clock pattern, and then outputting the results from the data elements 202. The test tool 210 is able to obtain these results and compare the results to simulated results in order to detect and identify faults.

It should be understood that many variations are possible based on the disclosure herein. Although features and elements are described above in particular combinations, each feature or element can be used alone without the other features and elements or in various combinations with or without other features and elements.

In some examples, the test tool 210 executes within the device 100 (e.g., on the processor 102). In some examples, the hardware logic network 300 is a part within the device 100 (e.g., the processor 102). In some examples, the device 100 executes the test tool 210 that tests a component external to the device 100 as described. In some examples, the hardware logic network 300 is a part of a component of the device 100 and the testing occurs with that component removed from the device 100.

The various functional units illustrated in the figures and/or described herein (including, but not limited to, the processor 102, the auxiliary devices 106 (including the IO devices 118 and auxiliary processor 114), test tool 210, device 301, clock controller 310, or mask controller 312) may be implemented as a hardware electronic circuit (e.g., an analog circuit, a digital circuit, a field programmable gate array, any other type of circuit, or a combination thereof), a general purpose computer, a processor, or a processor core, as a program, software, or firmware, stored in a non-transitory computer readable medium or in another medium, executable by a general purpose computer, a processor, or a processor core, or as a combination of two or more of a processor, a circuit, or software. The methods provided can be implemented in a general purpose computer, a processor, or a processor core. Suitable processors include, by way of example, a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), and/or a state machine. Such processors can be manufactured by configuring a manufacturing process using the results of processed hardware description language (HDL) instructions and other intermediary data including netlists (such instructions capable of being stored on a computer readable media). The results of such processing can be mask-works that are then used in a semiconductor manufacturing process to manufacture a processor which implements features of the disclosure.

The methods or flow charts provided herein can be implemented in a computer program, software, or firmware incorporated in a non-transitory computer-readable storage medium for execution by a general purpose computer or a processor. Examples of non-transitory computer-readable storage mediums include a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

What is claimed is:

1. A method, comprising:
    based on a clock pattern, determining an enable configuration for setting enable signals for one or more multi-cycle paths of a hardware logic network;
    controlling a selector to set the enable configuration for the one or more multi-cycle paths; and
    executing testing operations for the hardware logic network with the one or more multi-cycle paths enabled according to the enable configuration.

2. The method of claim 1, wherein the selector includes a first multiplexor that is not on a critical path for the hardware logic network.

3. The method of claim 2, wherein the critical path includes the one or more multi-cycle paths and does not include any elements for selecting between a scan network and a disable signal.

4. The method of claim 2, wherein the first multiplexor is configured to select between a scan network and a disable signal based on a control signal.

5. The method of claim 4, wherein the selector further comprises a second multiplexor configured to select between an output of the first multiplexor and the output of a multi-cycle path.

6. The method of claim 1, wherein the clock pattern indicates which cycles of a master clock to update stored values of clocked data elements of the hardware logic network.

7. The method of claim 6, wherein determining the enable configuration comprises:
    in response to the clock pattern indicating that data elements should be updated on back-to-back cycles, determining that each multi-cycle path of the one or more multi-cycle paths should be disabled.

8. The method of claim 6, wherein determining the enable configuration comprises:
    in response to the clock pattern indicating that data elements should be updated in a schedule that includes at least one skipped cycle, determining that multi-cycle paths having cycle closures corresponding to the clock pattern should be enabled and that multi-cycle paths having cycle closures other than that corresponding to the clock pattern should be disabled.

9. The method of claim 1, wherein setting the enable configuration includes setting a first one or more masks to enable input for multi-cycle paths determined to be enabled and setting a second one or more masks to fix input for multi-cycle paths determined to be disabled.

10. A system comprising:
a hardware logic network; and
a mask controller configured to:
based on a clock pattern, determine an enable configuration for setting enable signals for one or more multi-cycle paths of the hardware logic network;
control a selector to set the enable configuration for the one or more multi-cycle paths; and
execute testing operations for the hardware logic network with the one or more multi-cycle paths enabled according to the enable configuration.

11. The system of claim 10, wherein the selector includes a first multiplexor that is not on a critical path for the hardware logic network.

12. The system of claim 11, wherein the critical path includes the one or more multi-cycle paths and does not include any elements for selecting between a scan network and a disable signal.

13. The system of claim 11, wherein the first multiplexor is configured to select between a scan network and a disable signal based on a control signal.

14. The system of claim 13, wherein the selector further comprises a second multiplexor configured to select between an output of the first multiplexor and the output of a multi-cycle path.

15. The system of claim 10, wherein the clock pattern indicates which cycles of a master clock to update stored values of clocked data elements of the hardware logic network.

16. The system of claim 15, wherein determining the enable configuration comprises:

in response to the clock pattern indicating that data elements should be updated on back-to-back cycles, determining that each multi-cycle path of the one or more multi-cycle paths should be disabled.

17. The system of claim 15, wherein determining the enable configuration comprises:
in response to the clock pattern indicating that data elements should be updated in a schedule that includes at least one skipped cycle, determining that multi-cycle paths having cycle closures corresponding to the clock pattern should be enabled and that multi-cycle paths having cycle closures other than that corresponding to the clock pattern should be disabled.

18. The system of claim 10, wherein setting the enable configuration includes setting a first one or more masks to enable input for multi-cycle paths determined to be enabled and setting a second one or more masks to fix input for multi-cycle paths determined to be disabled.

19. A non-transitory computer-readable medium storing instructions that, when executed by a processor, cause the processor to perform operations comprising:
based on a clock pattern, determining an enable configuration for setting enable signals for one or more multi-cycle paths of a hardware logic network;
controlling a selector to set the enable configuration for the one or more multi-cycle paths; and
executing testing operations for the hardware logic network with the one or more multi-cycle paths enabled according to the enable configuration.

20. The non-transitory computer-readable medium of claim 19, wherein the selector includes a first multiplexor that is not on a critical path for the hardware logic network.

* * * * *